United States Patent [19]
Robertson

[11] Patent Number: 5,161,122
[45] Date of Patent: Nov. 3, 1992

[54] REGISTER WRITE BIT PROTECTION APPARATUS AND METHOD

[75] Inventor: Iain C. Robertson, Bedford, Great Britain

[73] Assignee: Texas Instruments, Incorporated, Dallas, Tex.

[21] Appl. No.: 387,553

[22] Filed: Jul. 28, 1989

[51] Int. Cl.⁵ .......................... G11C 7/00; G06F 12/14
[52] U.S. Cl. ..................... 365/195; 365/226; 365/228; 395/425; 364/246.8; 364/969.4
[58] Field of Search ............... 365/195, 94, 96, 120, 365/196, 226, 228, 189.01; 380/4, 5, 6; 340/825.31; 377/55, 70, 73, 74; 364/246.8, 246.9, 969.4, 969.3, 200 MS File, 900 MS File; 395/425

[56] References Cited

U.S. PATENT DOCUMENTS

| | | | |
|---|---|---|---|
| 3,160,876 | 12/1964 | Stochel | 341/100 |
| 3,564,517 | 2/1971 | McLean et al. | 365/195 |
| 4,429,300 | 1/1984 | Yamasawa et al. | 377/73 |
| 4,935,645 | 6/1990 | Lee | 365/225.7 |

OTHER PUBLICATIONS

Strauss, E., *80386 Technical Reference*, Brady Books, 1987, pp. 3–31.
Brumm, P. and D. Brumm, *80386 A Programming and Design Handbook*, TAB Professional and Reference Books, 1987, pp. 127–142.

*Primary Examiner*—Stuart S. Levy
*Assistant Examiner*—Jack A. Lane
*Attorney, Agent, or Firm*—Rose K. Castro; Holland, Robby T.; Richard Donaldson

[57] ABSTRACT

A register circuit and method which allows a multi-bit register to change states until such time as a particular dedicated bit is activated. Once the dedicated bit is turned to the logical on-state none of the bits, including the dedicated bit, can be changed until a reset signal is sensed.

13 Claims, 2 Drawing Sheets

REGISTER WRITE BIT PROTECTION APPARATUS AND METHOD

TECHNICAL FIELD OF THE INVENTION

This invention relates to a register control system and more particularly to a system which allows for the internal write bit protection control of the register.

CROSS REFERENCE TO RELATED APPLICATIONS

All of the following patent applicators are cross-referenced to one another, and all have been assigned to Texas Instruments Incorporated. These applications have been concurrently filed and are hereby incorporated in this patent application by reference.

| Attorney Docket # | Title |
| --- | --- |
| 387,568 | Video Graphics Display Memory Swizzle Logic and Expansion Circuit and Method |
| 387,567 | Video Graphics Display Memory Swizzle Logic Circuit and Method |
| 387,459 | Graphics Floating Point Coprocessor Having Matrix Capabilities |
| 387,242 | Graphics Processor Trapezoidal Fill Instruction Method and Apparatus |
| 387,550 | Graphic Processor Three-Operand Pixel Transfer Method and Apparatus |
| 387,119 | Graphics Processor Plane Mask Mode Method and Apparatus |
| 386,936 | Dynamically Adaptable Memory Controller For Various Size Memories |
| 387,472 | Graphics Processor Having a Floating Point Coprocessor |
| 387,553 | Register Write Bit Protection Apparatus and Method |
| 387,569 | Graphics Display Split-Serial Register System |
| 387,455 | Multiprocessing Multiple Priority Bus Request Apparatus and Method |
| 387,325 | Processing System Using Dynamic Selection of Big and Little Endian Coding |
| 386,057 | Graphics Processor Nonconfined Address Calculation System |
| 386,850 | Real Time and Slow Memory Access Mixed Bus Usage |
| 387,479 | Graphics Coprocessor Having Imaging Capability |
| 387,255 | Graphics Floating Point Coprocessor Having Stand-Alone Graphics Capability<br>Graphics Floating Point Coprocessor Having Vector Mathematics Capability |
| 386,849 | Improvements in or Relating to Read-Only Memory |
| 387,266 | Method and Apparatus for Indicating When a Total in a Counter Reaches a Given Number |

BACKGROUND OF THE INVENTION

Computer systems commonly have arrangements where certain registers are used in the system for controlling the mode of the system in one way or another. These registers, sometimes called flag registers, accept a bit and, based upon that bit, reconfigure the system for a particular type of operation. One type of such control bit configuration is shown in the co-pending patent application which is being filed concurrently herewith and entitled "Processing System Using Dynamic Selection of Big Endian and Little Endian Coding," Ser. No. 387,325, which application is incorporated herein by reference. Sometimes these bits control row size or column size of a memory and sometimes these bits control other functions, some of which can be critical to the proper operation of the system.

Because of the critical nature of such flag registers, it is imperative that once the bits of the flag register are set, they not be changed under any condition until a new initialization of the system. However, as systems presently stand, mistakes in programming or mistakes in presentation of data on a bus could cause a register to change and thus reconfigure the system with drastic results.

In the prior art systems, a user is instructed not to change the bits in the flag register during normal operation. However, this requires extreme care. Sometimes safeguards are built into the software. However, in most systems an experienced operator can bypass the software safeguards. In addition, mistakes in the software in one form or another, accidentally or on purpose, as for example, by a virus, could cause the system to change, again with drastic negative results.

Thus, there is a need in the art for a system which will allow certain registers to contain critical control information and which will allow these registers to be changed by a user. However, once the user determines that the information within the register should no longer be changeable, the register must be locked closed so that even mistakes in programming will not affect the register.

SUMMARY OF THE INVENTION

An arrangement of registers is provided which allows for sections of the register to be written in the normal manner. The register is arranged such that one or more bits of the register are dedicated to the protection of the register. As long as these dedicated bits remain a logical 0 (or logical 1 in some situations), the other bits of the register can be changed. However, once these dedicated control bits receive a logical 1, none of the register bits can be changed under any condition without down powering and rebooting the system.

Thus, for example, a register could have five bits, four of which can be changed depending upon the configuration of the system. These bits could be changed many times provided the fifth bit remains 0. However, once the fifth bit becomes 1, the entire register is frozen and no amount of programming changes nor bus data changes can affect the register until such time as the register is downpowered and the system rebooted.

Thus, there is a technical advantage in that a register can be made internally self-protective. The bits of the register are free to change under control of the user or under control of the system. However, once the dedicated freeze bit is set, the register bits cannot be changed. Since the dedicated freeze bit is contained within the register, that bit can also not be changed without resetting the entire system.

BRIEF DESCRIPTION OF THE DRAWINGS

For a more complete understanding of the present invention and for further advantages thereof, reference is now made to the following Detailed Description taken in conjunction with the accompanying Drawing in which.

DETAILED DESCRIPTION OF THE INVENTION

Figure 1:
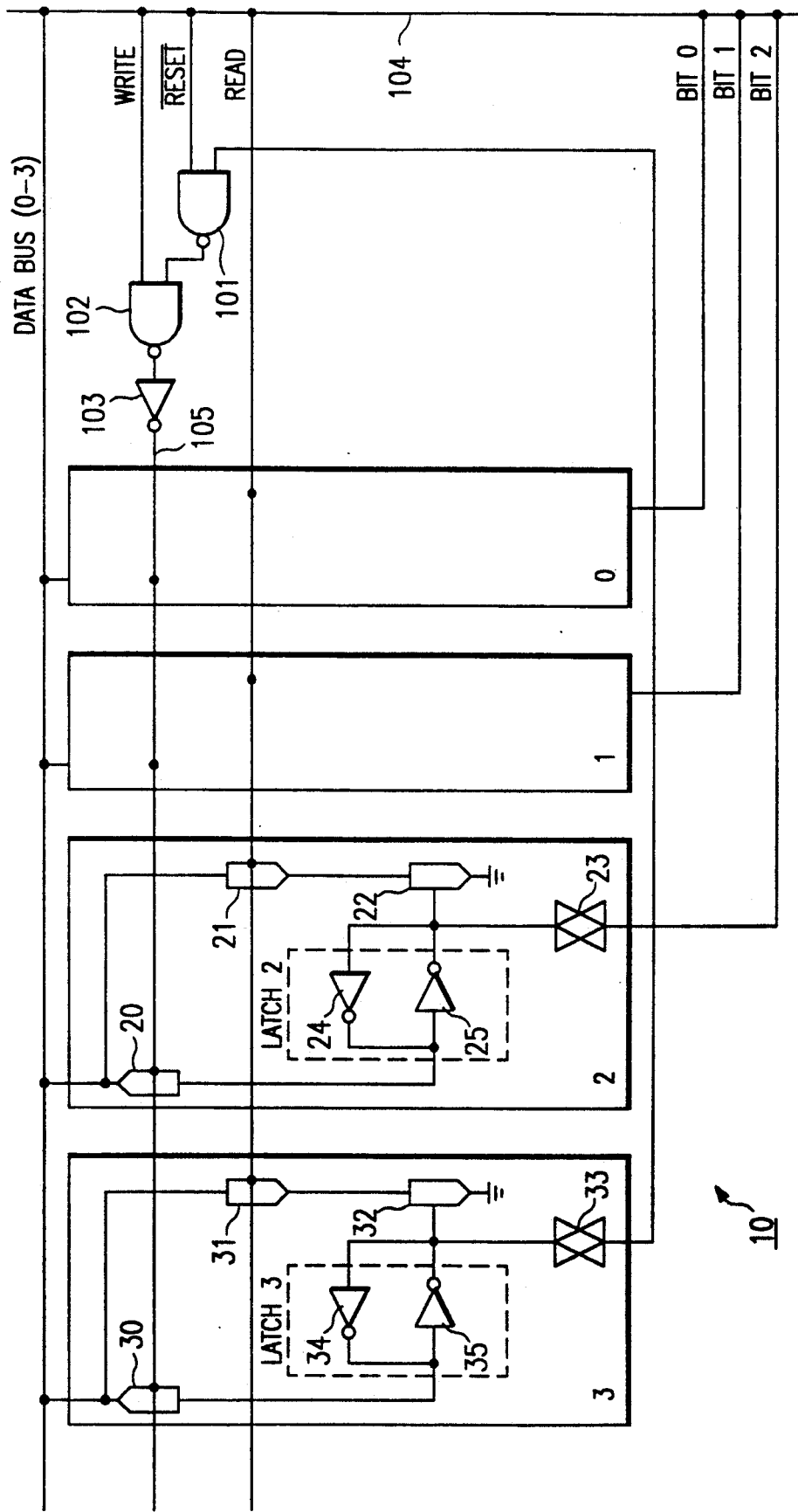
FIG. 1 is a schematic representation of a multi-bit register in accordance with the preferred embodiment of the present invention.

Prior to discussion of the operation of the register as shown in FIG. 1, it should be noted that this register system and method can be used in any one of a number of systems operating with or without a microprocessor. One such system is shown in copending patent application Ser. No. 346,388, filed Apr. 27, 1989 now continuation application Ser. No. 426,480, filed Oct. 23, 1989, which application is incorporated herein by reference.

Turning now to FIG. 1, register circuit 10 is shown connected to main system bus 104. This bus can be utilized to read and write bits to and from registers 0 through 3 under control of a processor or other CPU (not shown). This operation would be in the traditional manner and would be in conjunction with the system as above discussed. Data bus (0-3) would be utilized for bringing information to and from registers 0 through 3 via bus 104. Each register 0 through 3 has a latch, such as latch 3 for register 3, which latch operates in a well known fashion so that, upon being set, will remain set until the bit is either cleared or a new bit is written into the register. Bits are written from data bus (0-3) into the register under control of a signal on lead 105, which opens the various registers to data bus (0-3) via an N-channel transistor circuit 30, as shown with respect to register 3. In register 3, latch 3 contains elements 34 and 35, which serve to hold any bit latched into this register in place in a traditional manner. Upon latching, a signal is provided, after delay at the output of delay element 33, which signal is fed back to become an input to gate 101. Initially, a 0 is written into latch 3 of register 3, thereby causing the output of element 33 to be low, which low is supplied to gate 101.

During power-up, lead RESET receives a logic 0, thereby allowing the output of gate 101 to go high, which effectively allows gate 102 to function under control of signals on lead WRITE. Thus, in order to clear all registers, 0's are placed on data bus (0-3), and a 1 is presented on the WRITE lead. This allows lead 105 to go high and effectively allows registers 0-3 to take data from the bus (0-3), which in this case is the RESET data, all 0's. Of course, this RESET data need not be all 0's.

After reset, as discussed above, register 3 contains a 0, the output of element 33 is low, thereby controlling gate 101 so that subsequent WRITE entries are under the exclusive control of a high being presented on the WRITE lead. Thus, from time to time, providing latch 3 of register 3 remains unset, data can be written from data bus (0-3) into the registers, 0, 1 and 2, under traditional methods. Also, during this period of time, data can be read from all of the registers under control of signals over the READ lead. Again, this is the traditional register function and is well known in the art.

Assume now that data from data bus (0-3) contains a 1 for register 3. In this situation, the WRITE lead would have a 1 placed thereon and the output on lead 105 would go high. The bit would be read from data bus 0-3) into latch 3 of register 3. At this point, the output of element 33 would go high and since the RESET lead is high, the output of gate 101 would be low, thereby taking control of gate 102 such that signals on the WRITE lead would have no effect on lead 105 of gate 103. Accordingly, so long as a data bit remains in register 3, no change to registers 0 through 2 can occur because the WRITE control lead 105 is effectively inhibited. However, during this period of time, all registers can be read under control of signals on lead READ.

Clearly, the registers can function in the traditional manner, provided register 3 does not have data written thereto. Once this occurs, the data in register 3 prevents the changing of data into any of the registers, including register 3, until a new RESET pulse is sent from the main processor over main system bus 104. In this manner, the register is internally controlled, which control includes protection of the control bit itself.

It must be noted that, while a register having four segments has been detailed, this system can work with any number of segments, including a single segment. Also, it will be noted that any bit of the register can be used for control purposes. With a minor change in the circuit, any other bit, or any combination of bits can be used to control the register. Such a change would require the leads BIT0, BIT1 or BIT2 to be connected to gate 101 to form the proper logical control as desired.

Figure 2:
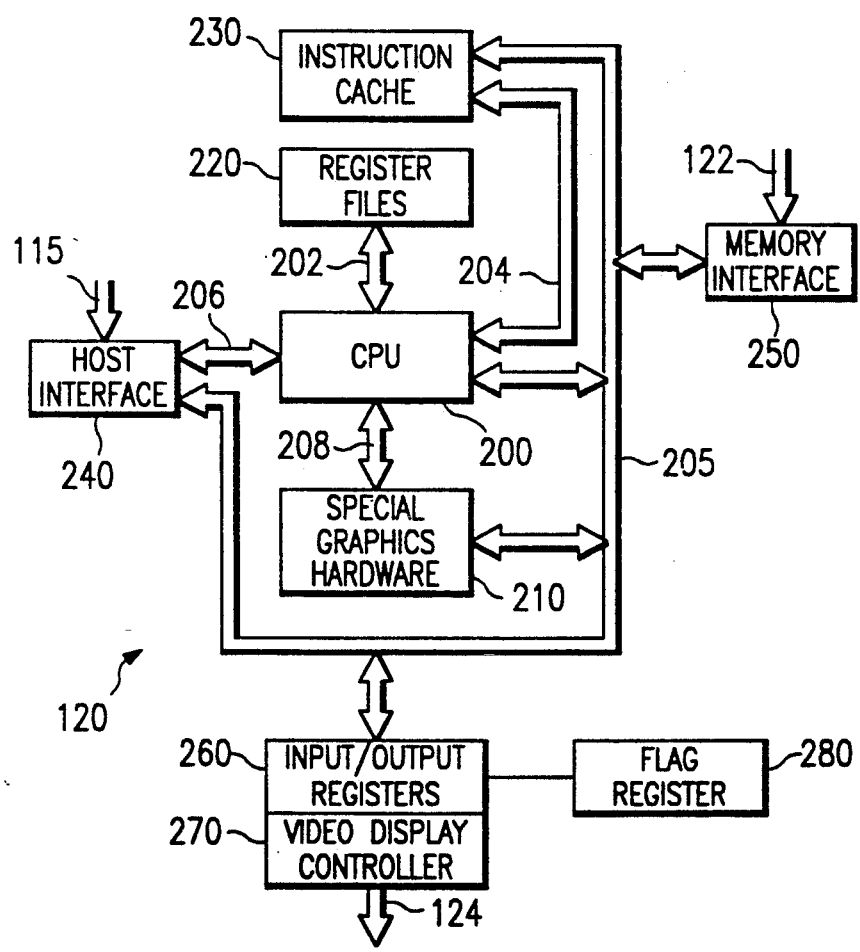
FIG. 2 is a typical system environment for such a register.

FIG. 2 shows the positioning of such a register, 280 in the system discussed in the aforementioned patent application. Another system in which this register arrangement can be utilized is a graphics system No. TMS 34020 available from Texas Instruments. A complete specification of the system has been published and is publicly available from Texas Instruments Inc., P.O. Box 1443, Houston, Tex. 77251-1443. Any number of other applications can be found for this circuit arrangement and method of operation.

Although the present invention has been described with respect to a specific preferred embodiment thereof, various changes and modifications may be suggested by one skilled in the art, and it is intended that the present invention encompass such changes and modifications as fall within the scope of the appended claims.

What is claimed is:

1. A computer system, comprising:
   a first processor; and
   a second processor comprising:
      a central processing unit;
      a communications interface and an internal bus connecting the communications interface to said central processing unit, said communications interface connected for data transfer between said central processing unit and said first processor;
      at least one register including bit storage circuits connected to said internal bus; and
      a protection circuit connected to a control line from said internal bus to enable entry of data into said at least one register from said internal bus when the control line is active, and fed by at least one of said bit storage circuits having one of first and second sates, said protection circuit responsive to the first state to prevent entry of the data into any of said bit storage circuits even when the control line is active.

2. The computer system of claim 1 wherein said protection circuit is responsive to said control line to enable entry of data into all of said bit storage circuits in said at least one register.

3. The computer system of claim 1 wherein only one of said bit storage circuits in said at least one register is dedicated to prevent entry, and said protection circuit includes a logic circuit responsive to a reset signal for resetting all of said bit storage circuits to a predetermined state even if an entry-preventing datum has been written to said dedicated bit storage circuit.

4. The computer system of claim 1 wherein said protection circuit includes a logic circuit responsive to a reset signal for resetting the state of each entry-preventing bit storage circuit to the second state.

5. The computer system of claim 1 wherein only one of said bit storage circuits feeds said protection circuit to prevent entry.

6. The computer system of claim 1 wherein said internal bus includes a read control line and said second processor further comprises an output enable circuit responsive to a read control line from said internal bus to supply data from said at least one register to said internal bus.

7. The computer system of claim 1 wherein said control line comprises a write line of said internal bus.

8. The computer system of claim 1 wherein a subset of said bit storage circuits are dedicated to prevent entry, and said central processing unit is operative to supply a write signal on the control line and to supply data to said at least one register including an entry preventing datum to each entry-preventing bit storage circuit.

9. A microprocessor device, comprising:
a central processing unit;
a communications interface and an internal bus connecting the communications interface to said central processing unit, said communications interface connected for data transfer externally;
at least one register including bit storage circuits connected to said internal bus; and
a protection circuit connected to a control line from said internal bus to enable entry of data into said at least one register from said internal bus when the control line is active, and fed by at least one of said bit storage circuits having one of a first and second state, said protection circuit responsive to the first state to prevent entry of the data into any of said bit storage circuits even when the control line is active.

10. A write protect circuit comprising:
at least one register including bit storage circuits having inputs and outputs;
gate logic having a control input to enable entry of data into all of the bit storage circuits of said at least one register when the control input is active; and
protect logic, fed by at least one of said bit storage circuits having one of first and second states, said protect logic connected to said gate logic and responsive to the first state to prevent entry of the data into any of said bit storage circuits even when the control line is active.

11. The write protect circuit of claim 10 wherein said protect logic has a reset input and is responsive to a reset signal thereon to override response to said first state.

12. A method of operating a computer having a central processing unit, a bus having data lines and at least one control line and at least one register including bit storage circuits connected to the bus, the method comprising the steps of:
enabling entry of data into said at least one register from said bus when a control line is active and
preventing entry of the data into any of said bit storage circuits, even when the control line is active, when a subset of the bit storage circuits has a predetermined state.

13. The method of claim 12 wherein said preventing step comprises loading said subset of said bit storage circuits to have said predetermined state.

* * * * *